(12) United States Patent
Vittu

(10) Patent No.: US 9,431,442 B2
(45) Date of Patent: Aug. 30, 2016

(54) OVERMOLDED RECONSTRUCTED CAMERA MODULE

(71) Applicant: Apple Inc., Cupertino, CA (US)

(72) Inventor: Julien C. Vittu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/611,950

(22) Filed: Feb. 2, 2015

(65) Prior Publication Data
US 2016/0225809 A1 Aug. 4, 2016

(51) Int. Cl.
*H01L 31/0232* (2014.01)
*H01L 27/146* (2006.01)
*H01L 21/56* (2006.01)

(52) U.S. Cl.
CPC ....... *H01L 27/14618* (2013.01); *H01L 21/565* (2013.01); *H01L 21/568* (2013.01); *H01L 27/1469* (2013.01); *H01L 27/14634* (2013.01); *H01L 27/14636* (2013.01); *H01L 27/14685* (2013.01); *H01L 31/02325* (2013.01)

(58) Field of Classification Search
CPC .................. H01L 27/14618; H01L 27/14636; H01L 27/14685; H01L 27/1469; H01L 21/565; H01L 21/568; H01L 31/02325; H01L 23/481; H01L 23/39827
USPC .................................................. 257/432, 434
See application file for complete search history.

(56) References Cited

U.S. PATENT DOCUMENTS

| | | |
|---|---|---|
| 5,278,726 A | 1/1994 | Bernardoni et al. |
| 6,571,466 B1 | 6/2003 | Glenn et al. |
| 6,921,676 B2 | 7/2005 | Ertel et al. |
| 7,199,438 B2 | 4/2007 | Appelt et al. |
| 7,616,250 B2 | 11/2009 | Watanabe et al. |
| 7,796,187 B2 | 9/2010 | Shangguan et al. |
| 7,972,060 B2 | 7/2011 | Guichard et al. |
| 8,607,444 B2 | 12/2013 | Jarvis et al. |
| 9,013,017 B2 | 4/2015 | Jin et al. |
| 2011/0286736 A1* | 11/2011 | Aizawa ............. H01L 27/14618 396/529 |
| 2013/0320471 A1* | 12/2013 | Luan ................. H01L 27/14618 257/432 |

FOREIGN PATENT DOCUMENTS

WO WO-2013079705 6/2013

\* cited by examiner

*Primary Examiner* — Tu-Tu Ho
(74) *Attorney, Agent, or Firm* — Blakely, Sokoloff, Taylor & Zafman LLP

(57) ABSTRACT

A camera module including a die having a top side and a bottom side, an image sensor is positioned on the top side of the die and a conductive via is formed through the die to provide an electrical connection between the top side and the bottom side; an overmold casing formed around the die; and a lens holder assembly attached to the top side of the die and the overmold casing. A method of producing a camera module including providing an image sensor die that is overmolded within a casing, the image sensor die having a top side and a bottom side, wherein an image sensor is positioned on the top side and a conductive via is formed through the image sensor die from the top side to the bottom side; and attaching a lens holder to the top side of the image sensor die.

20 Claims, 17 Drawing Sheets

OVERMOLDED RECONSTRUCTED CAMERA MODULE

FIELD

Embodiments related to an overmolded camera module are disclosed. More particularly, an embodiment related to an overmolded camera module and lens assembly is disclosed.

BACKGROUND

Camera modules have been incorporated into a variety of consumer electronics devices, including smart phones, mobile audio players, personal digital assistants, and both portable and desktop computers. A typical camera module includes an optical system used to collect and transmit light from an imaged scene to an image sensor. The optical system generally includes at least one lens associated with one aperture. The lens collects and transmits light to the image sensor. The aperture limits the light collected and transmitted by the lens, and is therefore termed the stop aperture, or alternatively, the entrance pupil aperture. The image sensor may be part of, or mounted to, a microelectronic or integrated circuit die, which is surrounded by a ceramic substrate. The ceramic substrate may include interconnects for providing electrical connections between the die and other components (e.g. a flex circuit). A cover glass to protect the image sensor may further be mounted to the ceramic substrate, over the image sensor.

Each of these components, however, are typically singulated elements that require a long assembly process and complex handling procedures. For example, in some cases, assembly includes positioning one or more image sensor dies (positioned within the ceramic substrate) within a carrier boat. The carrier boat may include a top layer and bottom layer and openings within which the image sensor dies are aligned and then sandwiched between the top and bottom layers so that they remain stationary during the remaining assembly steps (e.g. flip chip bonding, under fill, glass attach, etc). Properly positioning the sensor dies within the carrier boat openings and subsequent assembly steps can be very difficult and time consuming. In addition, the use of a ceramic substrate around each of the image sensor dies to provide electrical connections to and from the die can undesirably increase the overall x, y and z dimensions of the camera module because, for example, space must be provided between the die and the substrate to accommodate electrical connections (e.g. solder bumps) and underfill mounting materials (e.g. a glue) used to mount the substrate to the die.

SUMMARY

An overmolded camera module, particularly for use in portable consumer electronics device applications, is disclosed. In one embodiment, the overmolded camera module includes a microelectronic or integrated circuit die having a top side and a bottom side. An image sensor is positioned on the top side of the die and a conductive via is formed through the die to provide an electrical connection between the top side and the bottom side. A transparent member, such as a transparent window, may further be formed over the image sensor. An overmold casing is formed around the die and the transparent member, to produce an overmolded image sensing device which is relatively compact. A lens holder assembly is further attached to the top side of the die (i.e. side having the image sensor), over the transparent member and the overmold casing, to complete the camera module. In some embodiments, a conductive layer (e.g. a redistribution layer) may be formed from the via and over the casing to redistribute an electrical connection outside of the die. In addition, in still further embodiments, an electronic device such as a surface-mount device (SMD) may be embedded within the casing along with the die and additional conductive layers may be formed from the via to the SMD.

In an embodiment, a method of producing a camera module assembly is provided. The method includes overmolding an image sensor die to an adhesive carrier, for example, an adhesive layer or platform. The adhesive carrier or platform may serve as the die carrier during subsequent processing operations such that a separate carrier such as a carrier boat, as is commonly used, may be omitted. In addition, the image sensor die may include one or more conductive vias which are connected to one or more metallic layers (e.g. redistribution layers) which are formed on or within the overmold casing. In this aspect, the positioning of a ceramic substrate around the die to provide electrical connections is not necessary. The omission of the ceramic substrate may in turn decrease the x, y and z dimensions of the overall structure, in comparison to a structure in which the die is positioned within a ceramic substrate. More specifically, the method may include providing a carrier having an adhesive tape layer and attaching a die to the adhesive tape layer. The carrier may be, for example, a wafer or the like. The die may include a top side with an image sensor, for example an image sensor array, formed thereon and a bottom side. The conductive via(s) may be formed between the top side and the bottom side. The adhesive tape layer may be attached to the bottom side (i.e. the side opposite the image sensor). A transparent member may be positioned over the image sensor and attached to the top side of the die such that the image sensor is enclosed between the die and the transparent member. A mold material may be molded around exposed surfaces of the die and transparent member to form a casing around the die. Once the die is encased within the casing, a lens holder assembly may be positioned over the transparent member and the casing to form a molded camera module. A metal layer such as a redistribution layer may further be formed from one of the conductive vias to the casing to redistribute an electrical connection outside of the die. In addition, an electronic device (e.g. a surface-mount device) could be molded within a second molded casing formed over the first casing.

In another embodiment, the method may include providing an image sensor die that is overmolded within a mold material. The image sensor die may have an image sensor and a transparent member positioned on a top side and a conductive via formed through the image sensor die from the top side to the bottom side. A lens holder may further be attached to the top side of the overmolded image sensor die to form the camera module.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

Embodiments describe camera module assemblies, particularly for use in portable consumer electronics device applications. However, while some embodiments are described with specific regard to integration within mobile electronics devices, the embodiments are not so limited and certain embodiments may also be applicable to other uses. For example, a camera module as disclosed herein may be incorporated into an electronic device that remains at a fixed location, or is used in relatively stationary applications, e.g., as a lens in a multimedia disc player or desk top device having a display, for example, a computer.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment", or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

The use of relative terms throughout the description, such as "top" and "bottom" may denote a relative position or direction. For example, a "top edge", "top end" or "top side" may be directed in a first axial direction and a "bottom edge", "bottom end" or "bottom side" may be directed in a second direction opposite to the first axial direction. However, such terms are not intended to limit the use of the camera module disclosed herein to a specific configuration described in the various embodiments below. For example, a top side of a camera module or its components (e.g. a die or image sensor) may be directed in any direction with respect to an external environment.

Figure 1:
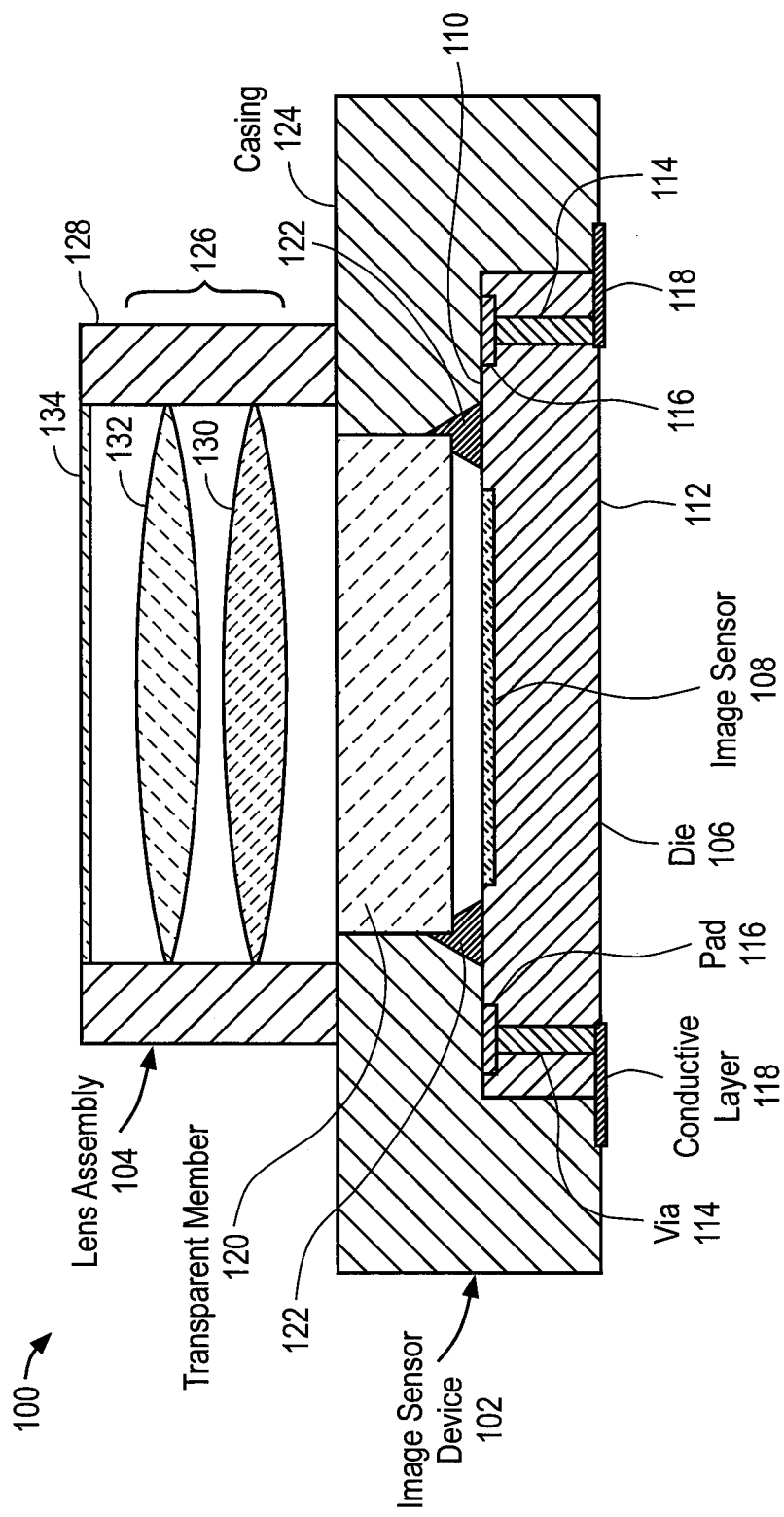
FIG. 1 is a cross-sectional side view of one embodiment of a camera module.

Referring to FIG. 1, FIG. 1 is a cross-sectional side view of one embodiment of a camera module. Camera module 100 may include an image sensor device 102 and a lens assembly 104 attached to the image sensor device 102. The image sensor device 102 may include a die 106. Die 106 may be, for example, a block of semiconducting material on, or within which, a functional circuit is fabricated. Die 106 therefore may also be referred to herein as a microelectronic die or an integrated circuit die. Die 106 may have an image sensor 108 positioned along one side such that die 106 may be considered an image sensor die and include suitable imaging circuitry. In the illustrated embodiment, die 106 includes a top side 110 (i.e. first side) and a bottom side 112 (second side) and image sensor 108 is positioned along top side 110. The terms "top side" and "bottom side" are used herein to refer to different sides of die 106, but do not necessarily refer to any particular die orientation. In other words, the "top side" of die 106 may be a side of die 106 facing one axial direction while the "bottom side" faces an opposite axial direction. Moreover, although image sensor 108 is described as being positioned along top side 110 of die 106, image sensor 108 could be positioned along bottom side 112 or both sides of die 106.

Die 106 may further include one or more vias 114 formed through die 106, between the top side 110 and the bottom side 112. In the view illustrated in FIG. 1, die 106 includes at least two vias 114. Vias 114 may be conductive (e.g. include a conductive material) such that they allow for electrical connections to run through die 106, and between electronic devices or components that may be mounted to the top side 110 and/or bottom side 112 of die 106. In this aspect, vias 114 may be referred to as conductive vias, or more specifically, through-silicon vias (TSV) in cases where die 106 is made of silicon. Contact pads 116 may further be provided at one or more of the ends of vias 114, in this case, the ends of vias 114 exposed through the top side 110 of die 106, to facilitate an electrical connection to a nearby device or component.

In one embodiment, a conductive layer 118, for example, a redistribution layer formed of a metal material, may extend from each of vias 114 outside of die 106 to redistribute an electrical connection outside of die 106 (e.g. to a device mounted near die 106). In the illustrated embodiment, conductive layers 118 are formed on the bottom side 112 of die 106 (i.e. a side of die 106 opposite image sensor 108). Since die 106 includes conductive vias 114 and conductive layers 118 electrically connected to each of the vias 114, a ceramic substrate, which would typically be used to provide electrical connections between the die and other components outside of the die, can be omitted.

Die 106 may further include a transparent member 120 positioned over image sensor 108. Transparent member 120 may help to protect image sensor 108 during the assembly process. Representatively, in one embodiment, transparent member 120 is a transparent glass or polymer window mounted directly to the top side 110 of die 106. For example, transparent member 120 may be mounted using a mounting material which forms mounting members 122, which also act as spacers to space transparent member 120 a distance from image sensor 108. In some embodiments, the mounting material may be an epoxy resin or other mounting material suitable for directly attaching transparent member 120 to die 106.

As previously discussed, die 106 does not need to be mounted within a ceramic substrate therefore transparent member 120 can be directly attached to the top side 110 of die 106, instead of a portion of a ceramic substrate positioned over the die, thereby reducing a z-height of image sensor device 102. With the ceramic substrate omitted, die 106 (including transparent member 120) can be encased within a casing 124 that conforms to the dimensions of die 106. In other words, casing 124 is formed directly on, and in contact with, surfaces of die 106. Representatively, casing 124 may be formed by a molding material such that casing 124 conforms to the size and shape of die 106 and transparent member 120. The molding material may be, for example, a polymer, an elastomer, a glass, or a thermoplastic. For example, the molding material may be a polymer such as an epoxy resin which cures to form an epoxy casing 124. It is noted that casing 124 should surround and contact all exposed sides of both die 106 and transparent member 120, and also overlap outer portions of the top surface 110 of die 106, but not overlap the top surface of transparent member 120 so that light can be transmitted through transparent member 120 to image sensor 108.

Representatively, casing 124 may be formed by an overmolding or injection molding process in which die 106 having transparent member 120 attached thereto is enclosed within a mold cope and a mold material is injected around die 106 and transparent member 120. Forming of casing 124 as an overmolded structure around die 106 and transparent member 120 helps to reduce x, y and/or z dimensions of image sensor device 102 in several ways. Said another way, casing 124 helps to reduce a width, length, and/or height dimension of image sensor device 102. For example, because casing 124 is molded directly to exposed surfaces of die 106 and transparent member 120, gaps around die 106 which may unnecessarily increase the x, y and/or z dimensions of image device assembly 102, and in turn, camera module 100, can be eliminated. For example, an x (width), z (height) and in some cases y (length) dimension of the image sensor device 102 may be from 100 microns to 200 microns less than those found in a device that is mounted within a ceramic substrate type carrier. In addition, since a ceramic substrate around die 106 is no longer necessary, transparent member 120 can be directly attached to die 106, and in turn encased within casing 124, thereby reducing a z-height dimension of image sensor device 102. Still further, an overlap between casing 124 and the top side 110 of die 106 can be controlled, and in some cases reduced below that which is seen when a ceramic substrate is used, which in turn may allow for an increase in a surface area of image sensor 108.

Once the image sensor device 102 is complete, i.e. die 106 and transparent member 120 are encased within casing 124, lens assembly 104 is attached to image sensor device 102 to complete the camera module. Representatively, lens assembly 104 may be positioned over image sensor 108 and mounted to casing 124. Lens assembly 104 may be any type of lens assembly suitable for implementation within a camera module. For example, in one embodiment, lens assembly 104 may include a lens stack 126 mounted within a support structure 128 (e.g. a barrel). The lens stack 126 may, for example, include two lenses 130, 132 aligned along an optical axis between external window 134 and image sensor 108, which facilitate transmission and/or focusing of light rays on image sensor 108. Although not illustrated, lens assembly 104 may include numerous lenses, filters, and other optical components aligned along an optical axis to achieve various optical functionalities. External window 134 may, for example, be a transparent glass or polymer window located substantially coplanar with a mobile device housing.

It should further be understood that, although not shown, other components such as flexible circuit boards, voice coil motors, filters, covers, support members, etc. may be connected to camera module 100 to support the various camera operations. In addition, although lens assembly 104 is shown attached to casing 124, it is contemplated that in some embodiments lens assembly 104 may be omitted. For example, in an embodiment where image sensor device 102 does not require an assembly of lenses for imaging, lens assembly 104 is omitted.

Figure 2:
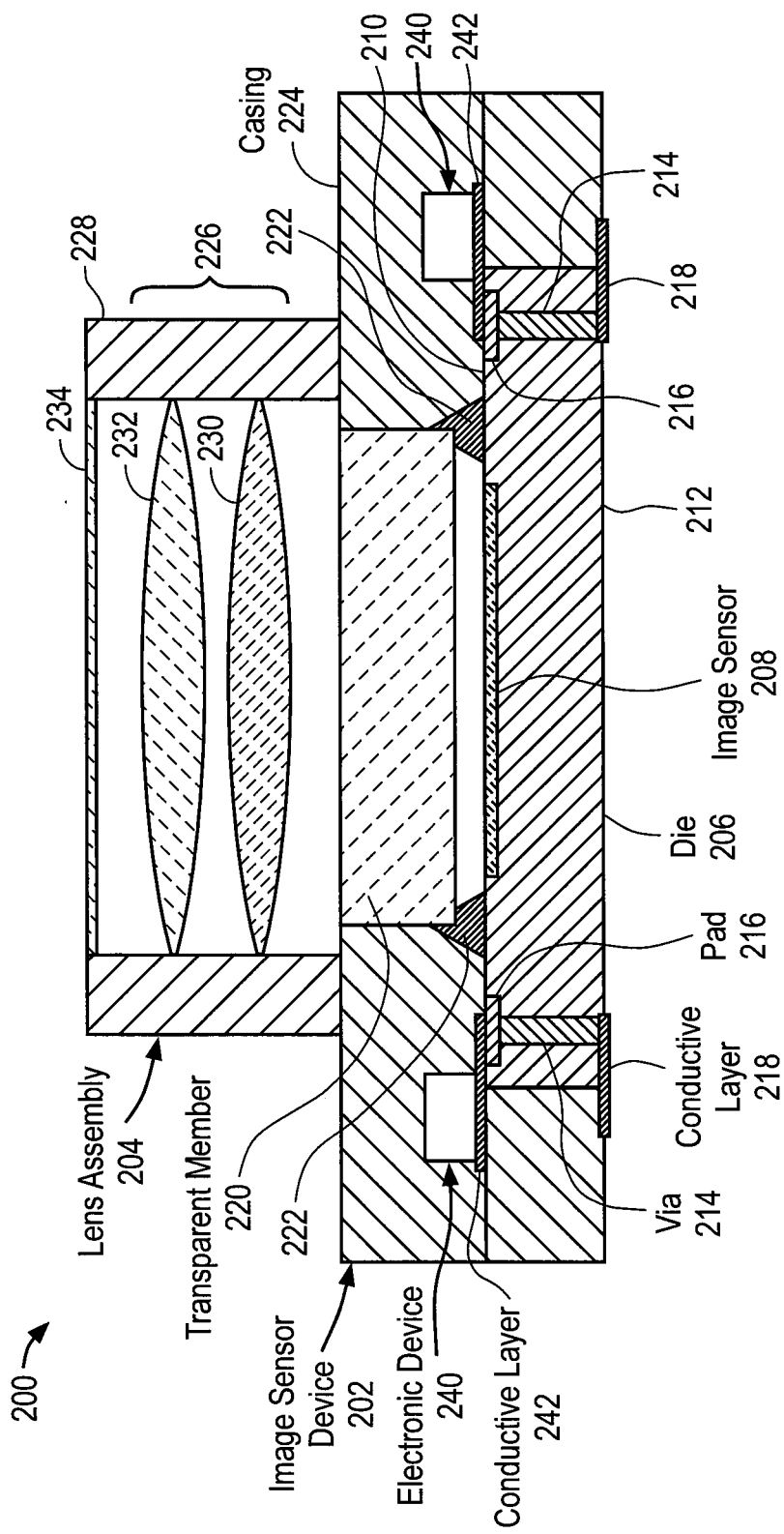
FIG. 2 is a cross-sectional side view of another embodiment of a camera module.

FIG. 2 is a cross-sectional side view of another embodiment of a camera module. Camera module 200 is substantially similar to camera module 100 described in reference to FIG. 1 except that in this embodiment, one or more electronic devices 240 are encased or overmolded within casing 224.

Representatively, similar to camera module 100, camera module 200 may include an image sensor device 202 and a lens assembly 204 attached to the image sensor device 202. The image sensor device 202 may include a die 206 having an image sensor 208 positioned along one side such that die 206 may be considered an image sensor die. In the illustrated embodiment, die 206 includes a top side 210 and a bottom side 212 and image sensor 208 is positioned along top side 210, although image sensor 208 may be positioned along bottom side 212 or both sides of die 206. Die 206 may further include one or more conductive vias 214 formed through die 206, between the top side 210 and the bottom side 212, contact pads 216 and conductive layers 218 as previously discussed in reference to FIG. 1.

Die 206 may further include a transparent member 220 positioned over image sensor 108 to, for example, protect image sensor 208 during the assembly process. Representatively, in one embodiment, transparent member 220 is a glass window mounted directly to the top side 210 of die 206. For example, transparent member 220 may be mounted using a mounting material which forms mounting members 222, which also act as spacers to space transparent member 220 a distance from image sensor 208, as previously discussed in reference to FIG. 1. It should be noted that because transparent member 220 is directly attached to the top side 210 of die 206, as opposed to a ceramic substrate within which die 206 is mounted (as may be the case with other systems), a z-height of image sensor device 202 may be reduced.

Image sensor device 202 may further include one or more of electronic devices 240 mounted to die 206. Electronic devices 240 may be, for example, a passive, active or electromechanical device mounted to top side 210 of die 206, in other words a surface-mount device (SMD). To facilitate an electrical connection with electronic devices 240, additional conductive layers 242 (i.e. redistribution layers) may be formed between pads 216 and electronic devices 240. Representatively, where electronic devices 240 are mounted to the top side 210 of die 206, conductive layers 242 may extend from pads 216 at the top side 210 of die 206 to a location outside of die 206.

Casing 224 may be formed around each of the previously discussed components (e.g. die 206, transparent member 220 and the associated electronic devices 240) using a molding process such that casing 224 conforms to the size and shape of die 206 and transparent member 220. Representatively, casing 224 may be formed by one or more overmolding or injection molding processes as discussed in reference to FIG. 1 such that an overmolded image sensor device 202 having a reduced x, y and z dimension is formed.

Once the image sensor device 202 is complete, i.e. die 206, transparent member 220 and electronic devices 240 are encased within casing 224, lens assembly 204 is attached to image sensor device 202. Representatively, lens assembly 204 may be positioned over image sensor 208 and mounted to casing 224. Lens assembly 204 may be any type of lens assembly suitable for implementation within a camera module. For example, in one embodiment, lens assembly 204 may include a lens stack 226 mounted within a support structure 228. The lens stack 226 may, for example, include two lenses 230, 232 aligned along an optical axis between external window 234 and image sensor 208, which facilitate transmission and/or focusing of light rays on image sensor 208. Although not illustrated, lens assembly 204 may include numerous lenses, filters, and other optical components aligned along an optical axis to achieve various optical functionalities. External window 234 may, for example, be a transparent glass or polymer window located substantially coplanar with a mobile device housing.

Figure 3:
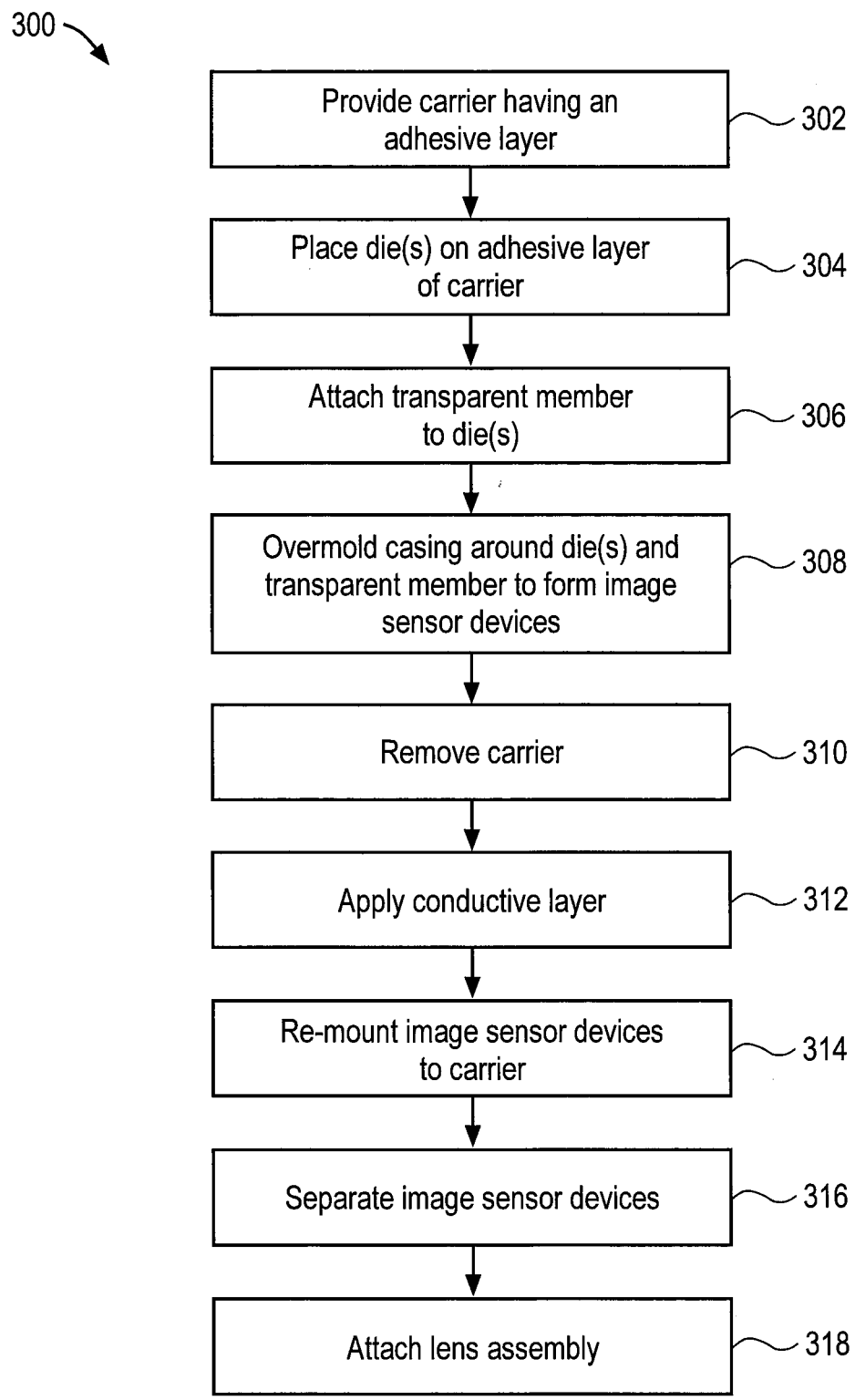
FIG. 3 is a flowchart of a process for producing a camera module in accordance with one embodiment.

FIG. 3 is a flowchart of a process for producing a camera module in accordance with one embodiment. Any one or more of the steps described in process 300 may be used to produce, for example, camera module 100 or module 200 described in reference to FIG. 1 and FIG. 2, respectively. Representatively, process 300 may include providing a carrier having an adhesive layer attached thereto (block 302). The carrier may be any type of carrier suitable for carrying an image sensor die during a camera module assembly process. For example, the carrier may be a wafer, such as a ceramic wafer, or the like. The adhesive layer may be applied to a surface of the carrier and be made of any type of adhesive material capable of adhering an image sensor die to the carrier. Representatively, the adhesive layer may be a type of adhesive tape laminated to a surface of the carrier.

One or more image sensor dies may be attached to the adhesive layer of the carrier (block 304). Representatively, a pick and place technique may be used to pick one or more preformed dies from a batch and then place them in desired locations on the adhesive layer such that a batch of dies are attached to the carrier for subsequent processing operations. The dies may be any one or more of dies 106 or 206 previously discussed in reference to FIG. 1 and FIG. 2, respectively. The dies may be placed on the carrier such that the side having the image sensor is exposed and facing away from the carrier. In other words, where the image sensor is on the top side of the die, the bottom side of the die is attached to the carrier.

Once the dies are attached to the carrier, a transparent member (e.g. transparent member 120 or 220) may be attached to each die (block 306). The transparent member is a glass window positioned over the die image sensor. In some embodiments, a glue, epoxy resin, resin or chemical bonding may be used to attach the transparent member to the die. In some cases, an optional plasma surface treatment technique may be used to facilitate attachment of the transparent member to the die. For example, a plasma gas may be applied to the die surface to enhance adhesion between the transparent member and the die.

Once the transparent member is attached to each die, a casing is molded around the dies to form image sensor devices (block 308). For example, in one embodiment, the casing is molded around the transparent member and die using an overmolding or injection molding process in which a mold material (e.g. epoxy resin) is injected around the components and then cured to form an overmolded image sensor device. In embodiments where several dies are attached to the carrier, the casing encases each of the dies such that all the dies are molded together on the carrier. In this aspect, the casing itself may serve as a die or image sensor device carrier during subsequent processing operations.

Representatively, the overmolded image sensor devices may be removed (e.g. picked) as a single unit from the adhesive so that processing of the bottom side of each device may occur (block 310). In some cases, either before or after removal of the image sensor devices from the carrier, the casing may be cured, such as by a thermal process. Since both sides of the image sensor devices are now exposed, one or more conductive layers can be formed on the surface of the die to redistribute an electrical connection formed through the die (e.g. vias 114) to a nearby device or component (block 312). The conductive layer may, for example, be a redistribution layer that is made of a metal material sputtered in a particular pattern along the die and casing.

The image sensor devices having the added conductive layers may be re-mounted to the carrier using the adhesive layer for further processing (block 314). Representatively, the further processing may include singulating or separating each of the image sensor devices on the carrier from one another (block 316). For example, the image sensor devices may be separated mechanically, such as by sawing through portions of the casing between each of the assemblies while the assemblies remain attached to the carrier, or a chemical process, such as by a chemical etching process.

Process 300 may further include attaching a lens assembly to each of the image sensor devices (block 318). The lens assembly may, for example, be any of lens assemblies 104, 204 previously discussed in reference to FIG. 1 and FIG. 2. Representatively, a manifold assembly having one or more lens assemblies attached thereto may be used to position and attach lens assemblies to respective ones of the image sensor devices. The image sensor devices having lens assemblies attached thereto may be subjected to a batch curing technique to cure the adhesive or mounting material (e.g. glue)

used to attach the lens assemblies to the image sensor devices to form the final camera modules.

Figure 4:
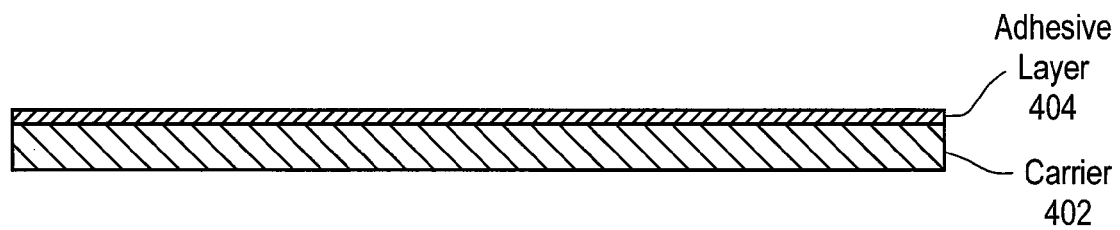
FIG. 4 is a pictorial view illustrating an operation for forming a camera module in accordance with one embodiment.

FIG. 4-FIG. 14 are pictorial views illustrating operations in forming a camera module in accordance with an embodiment. Referring to FIG. 4, FIG. 4 illustrates a carrier 402 having an adhesive layer 404 attached thereto. In one embodiment, carrier 402 may be a wafer or other type of carrier member suitable for supporting image sensor dies during a camera module assembly process as described herein. Adhesive layer 404 may be, for example, a layer of tape having a back side that is laminated to the carrier 402 and an adhesive side exposed. The adhesive side may have adhesive properties sufficient to adhere an image sensor die during a processing operation while also allowing for removal of the die without damaging the die when a sufficient force is applied.

Figure 5:
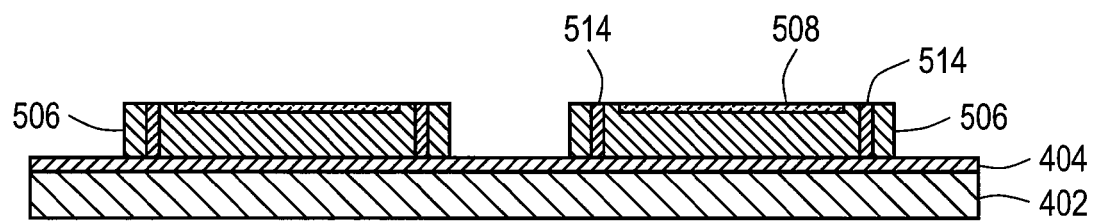
FIG. 5 is a pictorial view illustrating an operation for forming a camera module in accordance with one embodiment.

FIG. 5 illustrates the further processing operation of attaching a die to the carrier described in FIG. 4. Representatively, one or more of dies 506, similar to dies 106 and 206 described in reference to FIG. 1 and FIG. 2, respectively, are attached to the adhesive layer 404 of carrier 402. Each of dies 506 may be identical therefore for ease of illustration, only features of one of dies 506 are labeled in the Figures, but such labels should be understood as applying to the identical features illustrated in each of dies 506. In particular, each of dies 506 may include one or more of a via 514 and image sensor 508. In embodiments where the image sensor 508 is positioned on the top side of die 506, as illustrated in FIG. 5, the bottom side of die 506 is positioned on and attached to the adhesive layer 404 such that further processing may be performed on the top side of dies 506. In some embodiments, a pick and place technique may be used to place dies 506 on adhesive layer 404. For example, each of dies 506 may be picked from a batch of preformed image sensor dies and placed at predetermined processing locations on adhesive layer 404.

Figure 6:
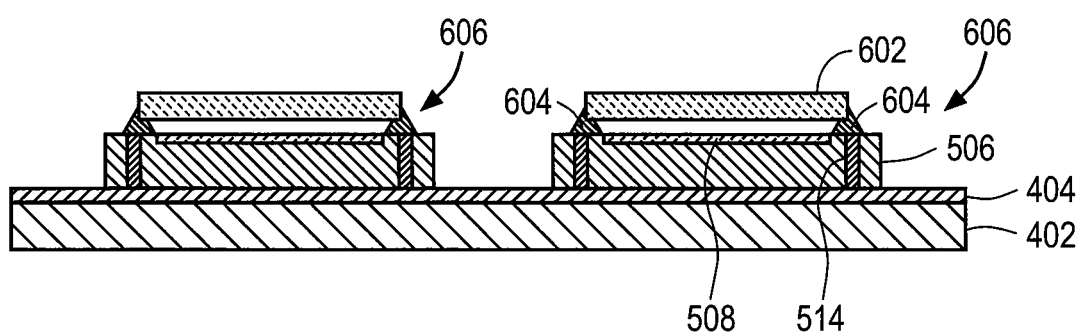
FIG. 6 is a pictorial view illustrating an operation for forming a camera module in accordance with one embodiment.

FIG. 6 illustrates the further processing operation of attaching a transparent member to the die(s) described in reference to FIG. 5. Representatively, a transparent member 602, such as a window made of a glass or other transparent material, is positioned over image sensor 508 and attached to die 506 to form image sensor devices 606. In one embodiment, transparent member 602 may be attached using mounting members 604. Representatively, in one embodiment, mounting members 604 may be made of a material that can be, for example, subjected to, or used in connection with, a plasma technique to enhance the attachment between transparent member 602 and die 506. Representatively, mounting members 604 may be an epoxy or other similarly suitable mounting material. In addition, mounting members 604 should serve as spacers between transparent member 602 and image sensor 508 such that a space or gap is formed between the two.

Figure 7:
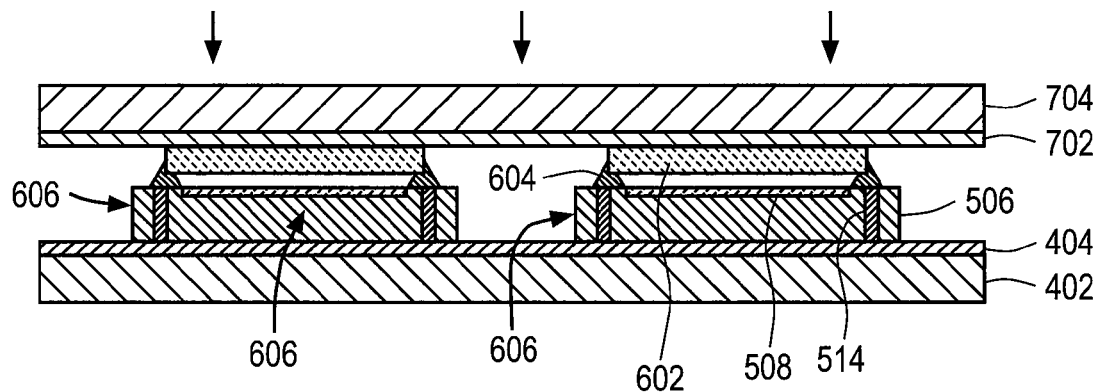
FIG. 7 is a pictorial view illustrating an operation for forming a camera module in accordance with one embodiment.

FIG. 7 illustrates the further processing operation of applying a protective film and mold cope over the transparent member of FIG. 6. The protective film 702 may be a layer of material that is removably applied over the exposed side of transparent member 602 to protect transparent member 602 during a further processing operation. For example, in one embodiment, protective film 702 may be an adhesive film, which is positioned over transparent member 602. Once the protective film 702 is in place, a mold cope 704 may be applied (e.g. lowered) over the protective film 702. The mold cope 704 may serve to enclose the image sensor device 606 between cope 704 and carrier 402 so that the mold material can be injected around each die assembly attached to carrier 402.

Figure 8:
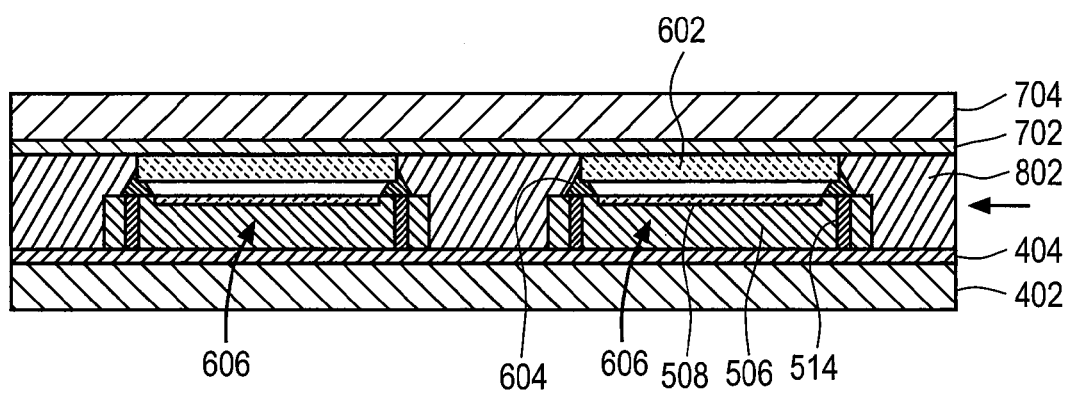
FIG. 8 is a pictorial view illustrating an operation for forming a camera module in accordance with one embodiment.

Representatively, as shown in FIG. 8, a mold material 802 (e.g. an epoxy resin or the like) is injected, poured or otherwise loaded into the space between mold cope 704/protective film 702 and carrier 402/adhesive layer 404 such that it surrounds each of the image sensor devices 606 attached to carrier 402. Once injected, the mold material 802 may be cured (such as by a heat) so that it forms a hard casing or overmold around each image sensor device 606.

Figure 9:
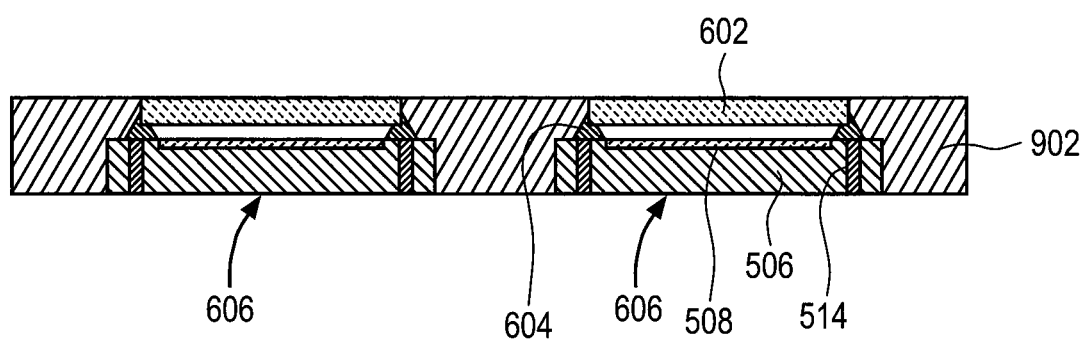
FIG. 9 is a pictorial view illustrating an operation for forming a camera module in accordance with one embodiment.

Once the casing is formed, the mold cope 704, protective film 702 and carrier 402 with adhesive layer 404 may be removed from the overmolded batch of die assemblies to form image sensor devices 606 as shown in FIG. 9. Since the image sensor devices 606 are encased within the overmolded casing 902, they remain in the same position as they were when attached to the carrier and therefore further processing may be performed on the devices 606 using the casing 902 as the carrier. Any suitable removal steps, and in any order, may be used. For example, in one embodiment, mold cope 704 and protective film 702 are first removed by applying a suitable force to expose the top side of each of the image sensor devices 606 followed by removal of adhesive layer 404 and carrier 402 to expose a bottom side of each of the image sensor devices 606 for further processing.

Figure 10:
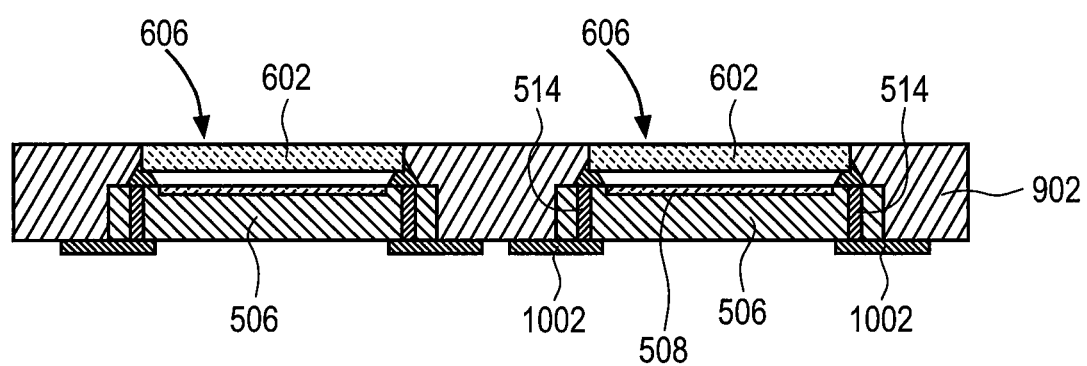
FIG. 10 is a pictorial view illustrating an operation for forming a camera module in accordance with one embodiment.

With the top and bottom surfaces of the image sensor devices 606 exposed, further processing on these surfaces can occur. Representatively, FIG. 10 illustrates the further processing operation of applying conductive layers to the image sensor device and casing described in FIG. 9. The conductive layers 1002 may, for example, be metallization layers applied using a sputtering technique. The conductive layers 1002 may serve as redistribution layers that redistribute an electrical connection from the image sensor devices 606 to other locations outside of the associated die. For example, conductive layers 1002 may be formed along a bottom side of die 506, from vias 514 to another location on casing 902.

Figure 11:
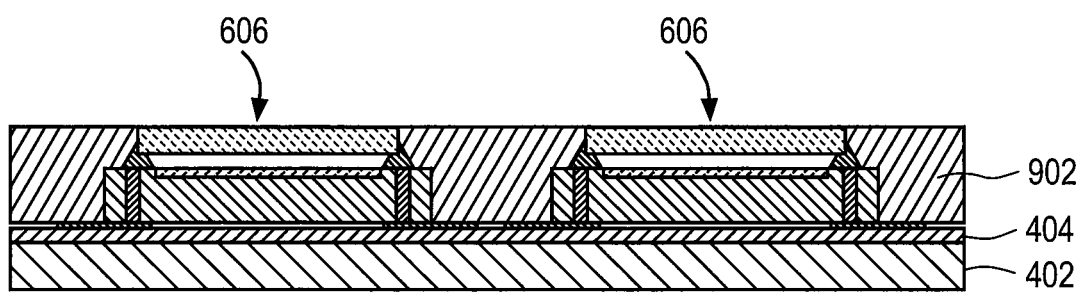
FIG. 11 is a pictorial view illustrating an operation for forming a camera module in accordance with one embodiment.

FIG. 11 illustrates the further processing operation of re-attaching the image sensor devices and casing to the carrier. Representatively, with processing on the bottom side of image sensor devices 606 complete, the bottom side of the devices may be re-attached to the adhesive layer 404 of the carrier 402 for further processing.

Figure 12:
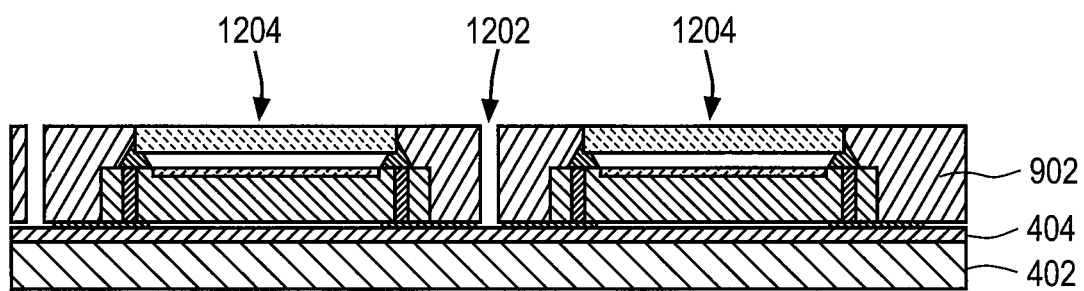
FIG. 12 is a pictorial view illustrating an operation for forming a camera module in accordance with one embodiment.

FIG. 12 illustrates the further processing operation of separating the image sensor devices from one another. Representatively, recesses 1202 may be formed through portions of casing 902 between each of devices 606 to form separately overmolded image sensor devices 1204. The recesses 1202 may be formed by, for example, a sawing operation or other similar technique suitable for forming recesses around devices molded in a casing 902. It is noted that while overmolded image sensor devices 1204 are now separately encased, they are still attached to carrier 402 therefore their location on carrier is maintained for further processing operations as desired.

Figure 13:
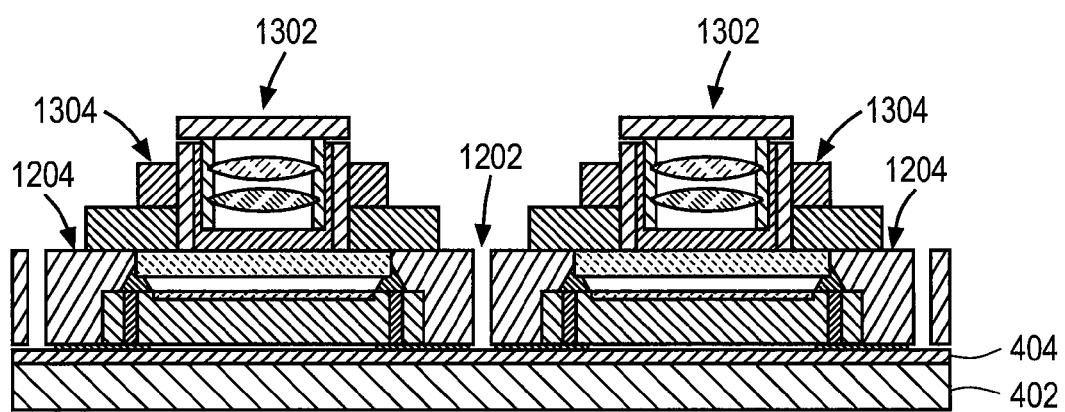
FIG. 13 is a pictorial view illustrating an operation for forming a camera module in accordance with one embodiment.

FIG. 13 illustrates the further processing operation of attaching a lens assembly to the overmolded image sensor devices of FIG. 12. Representatively, while devices 1204 are attached to carrier 402, lens assemblies 1302, such as those previously discussed in reference to FIG. 1 and FIG. 2, may be attached to respective ones of the overmolded image sensor devices 1204 to form assembled camera modules 1304. The lens assemblies 1302 may be attached to the overmolded image sensor devices 1204 using any standard technique. For example, the lens assemblies 1302 may be positioned over respective ones of the devices 1204 and then attached using an adhesive, mechanical, chemical or other suitable attachment technique.

Figure 14:
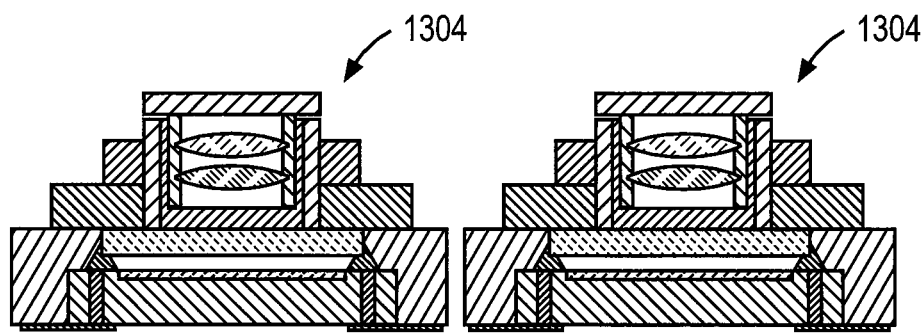
FIG. 14 is a pictorial view illustrating an operation for forming a camera module in accordance with one embodiment.

FIG. 14 illustrates the further processing operation of removing the carrier from the assembled camera modules. Representatively, camera modules 1304 are removed from carrier 402 by, for example, applying a force sufficient to overcome an adhesive force between adhesive layer 404 and camera modules 1304. Once removed from carrier 402, camera modules 1304 are separable units that may then be transferred and integrated into the desired electronic device.

Figure 15:
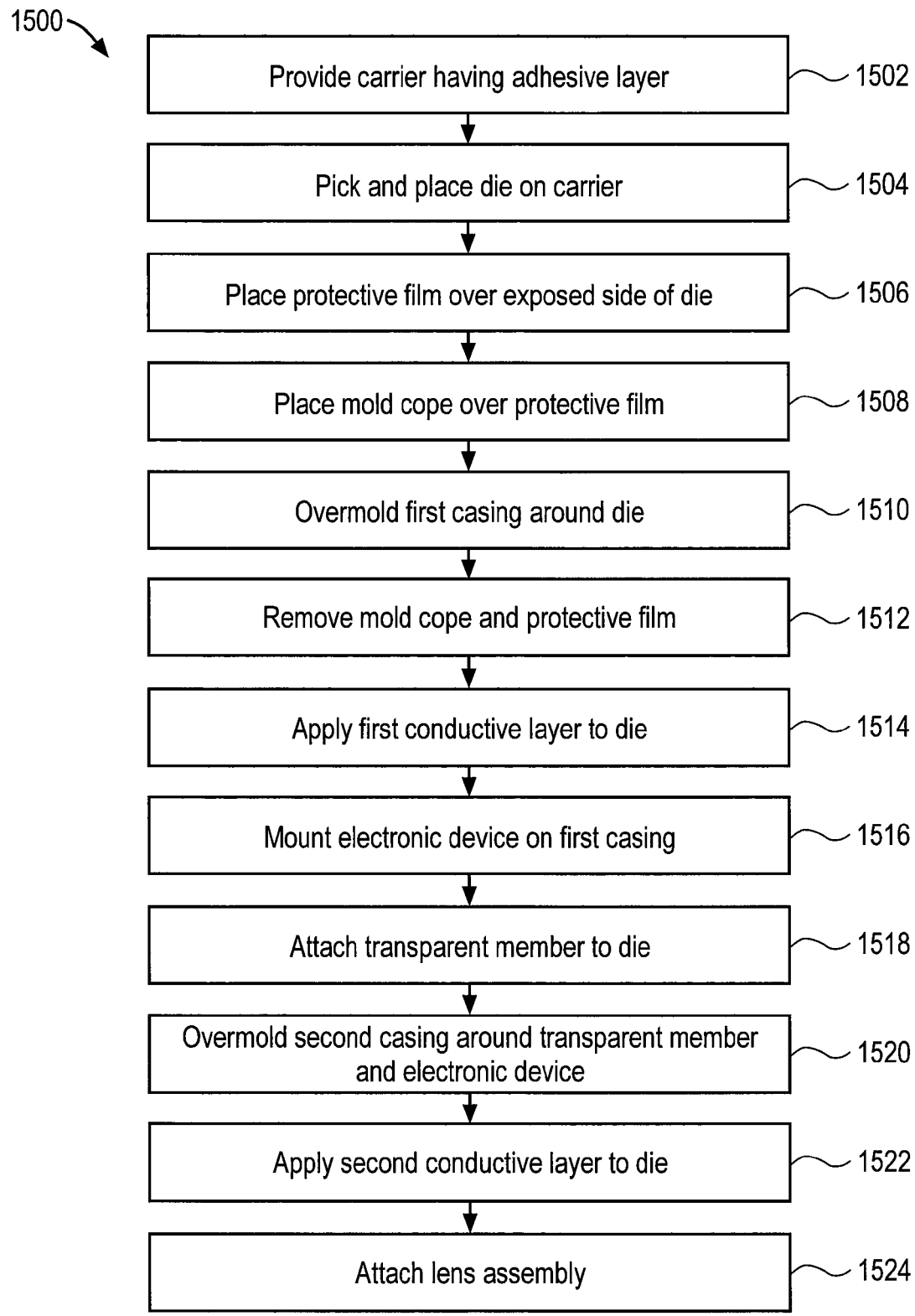
FIG. 15 is a flowchart of a method of producing a camera module in accordance with another embodiment.

FIG. 15 is a flowchart of a method of producing a camera module in accordance with another embodiment. One or more of the steps described in process 1500 may be used to produce, for example, camera module 200 described in reference to FIG. 2. Representatively, process 1500 may include providing a carrier having an adhesive layer attached thereto (block 1502). The carrier may be any type of carrier suitable for carrying an image sensor die during a camera module assembly process. For example, the carrier may be a ceramic wafer or the like. The adhesive layer may be applied to a surface of the carrier and be made of any type of adhesive material capable of adhering an image sensor die to the carrier. Representatively, the adhesive layer may be a type of adhesive tape laminated to a surface of the carrier.

One or more image sensor dies may be attached to the adhesive layer of the carrier using, for example, a pick and place technique (block 1504). The dies may be any one or more of dies 106 or 206 previously discussed in reference to FIG. 1 and FIG. 2, respectively. For example, the dies may include image sensors and conductive vias formed through the dies such that electrical connections can be made through the dies and a ceramic substrate around the die to facilitate electrical connections is not required. The dies may be placed on the carrier such that the side having the image sensor is exposed and facing away from the carrier. In other words, where the image sensor is on the top side of the die, the bottom side of the die is attached to the carrier.

Once the die is attached to the carrier, a protective film may be positioned over the exposed side of the die to protect the die during subsequent overmolding operation (block 1506). The protective film may be any type of film suitable for preventing damage to the die during, for example, a molding process. It is noted that in this embodiment, in contrast to the processing operation described in reference to FIG. 7, the protective film is applied over the die before adding the transparent member (e.g. window) over the image sensor on the die.

With the protective film over the die, a mold cope is placed over the protective film (block 1508). A first overmold casing may then be formed around the die (block 1510). Representatively, the first casing may be formed by injecting, or otherwise introducing, a mold material between the mold cope and the carrier such that it surrounds the die sandwiched therebetween. Once the mold material is cured, the mold cope and protective film may be removed leaving behind a number of dies overmolded together on the carrier (block 1512).

With the top sides of the dies now exposed, a first conductive layer (e.g. conductive layer 242 described in reference to FIG. 2) may be applied to the top side of each die (block 1514). The first conductive layer may be substantially similar to the previously discussed conductive layer described in reference to (block 314) of FIG. 3 except that it is on a top side rather than a bottom side of the die.

Process 1500 may further include mounting an electronic device to the die and first casing (block 1516). The electronic device may be, for example, an electronic device such as electronic device 240 described in reference to FIG. 2. The electronic device may be electrically connected to the first conductive layer such that an electrical connection is made between the die and the electronic device.

In addition, a transparent member may be attached over the image sensor of the die to protect the die during subsequent processing operations and complete the image sensor device (block 1518). The image sensor device and electronic device may then be encased within a second casing (block 1520). Representatively, a protective film and mold cope may be positioned over the transparent member such that the image sensing device is sandwiched between the cope/film layer and the carrier as described in reference to (block 308) of FIG. 3. A molding material (e.g. epoxy resin) may then be introduced (e.g. injected) between the cope/film layer and carrier and around each of the image sensing devices.

With the image sensing devices and electronic devices encased within a casing (e.g. the first and second casing), the entire encased module may be removed from the carrier so that subsequent processing may be performed on the bottom side (or the top side) of the image sensing devices. Representatively, a second conductive layer (e.g. redistribution layer) may be applied to the bottom side of the die and casing (block 1522) as previously discussed in reference to (block 314) of FIG. 3. Finally, a lens assembly may be attached to each of the overmolded image sensing devices (block 1524) as previously discussed in reference to FIG. 3 and FIG. 13. The devices with lens assemblies attached may then be separated (such as by sawing and removing them from the carrier) to form singulated overmolded camera modules having an embedded electronic device. The modules formed according to process 1500 benefit from a decreased z-height because the electronic device is embedded in the casing, as opposed to mounted on top of, for example, a ceramic substrate surrounding the die.

It should further be recognized the processing operations described in FIG. 3-FIG. 15 allow for the formation of a very compact camera module with fewer processing operations and are therefore easier to manufacture. For example, the resulting camera module may have the smallest possible z-height dimension from the bottom of the die to the transparent member due to the elimination of the ceramic substrate carrier. In addition, the x and y dimensions of the camera module may be reduced because an under fill material, which is typically used between the die and the ceramic substrate to attach the two together, is no longer necessary. Instead, the casing is molded directly to, and contacts, exposed surfaces of the die. Still further, the manufacturing process is simplified because some operations typically used in assembling camera modules are no longer necessary, for example, operations such as loading dies into a carrier boat, applying an under fill between the die and ceramic substrate, curing of the under fill and flip chip operations.

Figure 16:
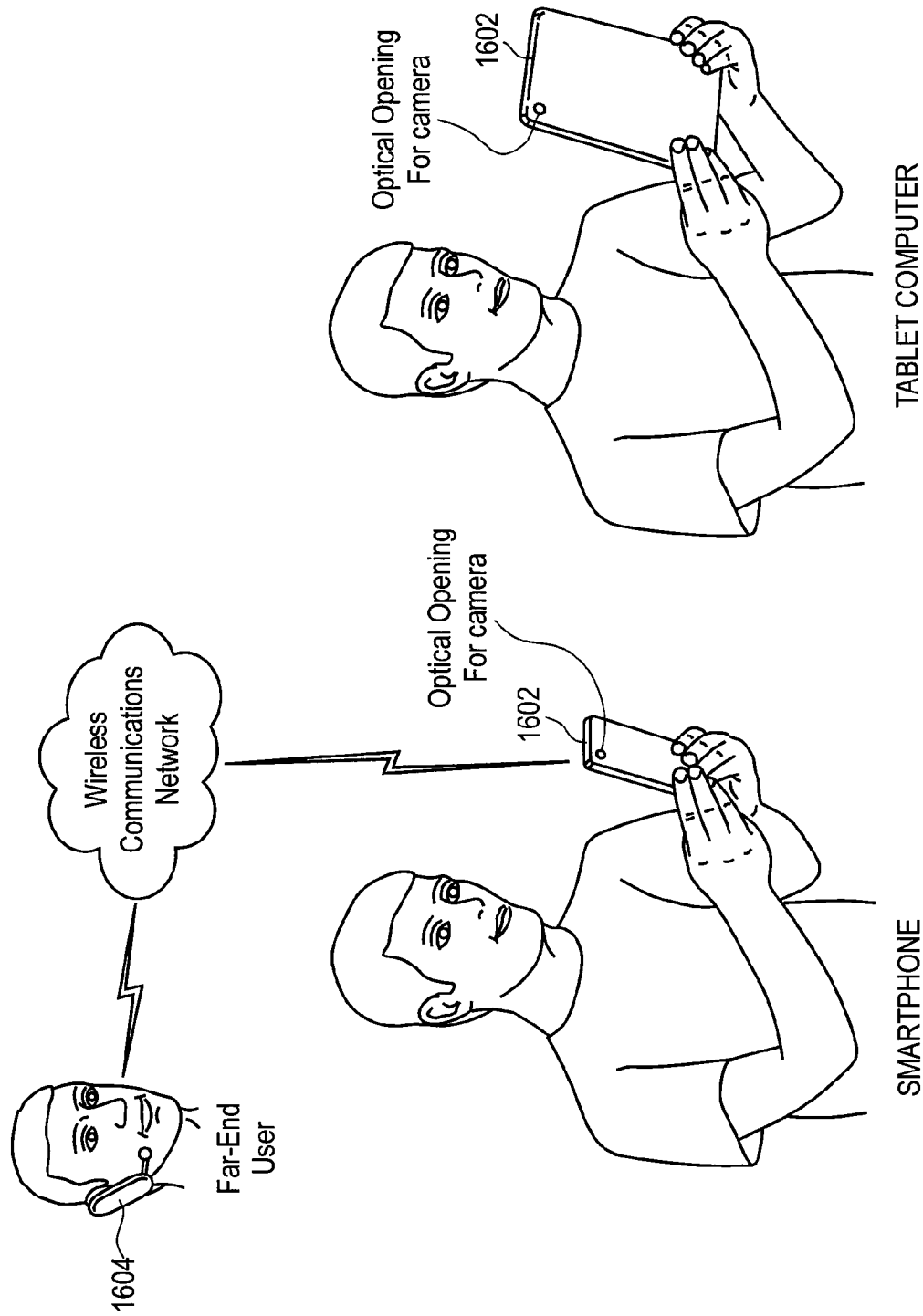
FIG. 16 illustrates one embodiment of a simplified schematic view of one embodiment of an electronic device in which a camera module may be implemented.

FIG. 16 illustrates one embodiment of a simplified schematic view of one embodiment of an electronic device in which a camera module may be implemented. As seen in FIG. 16, the overmolded camera module may be integrated within a consumer electronic device 1602 such as a smart phone with which a user can conduct a call with a far-end user of a communications device 1604 over a wireless communications network; in another example, the overmolded camera module may be integrated within the housing of a tablet computer. These are just two examples of where the camera module described herein may be used, it is contemplated, however, that the overmolded camera module may be used with any type of electronic device in which a camera module is desired, for example, a tablet computer, a desk top computing device or other display device.

Figure 17:
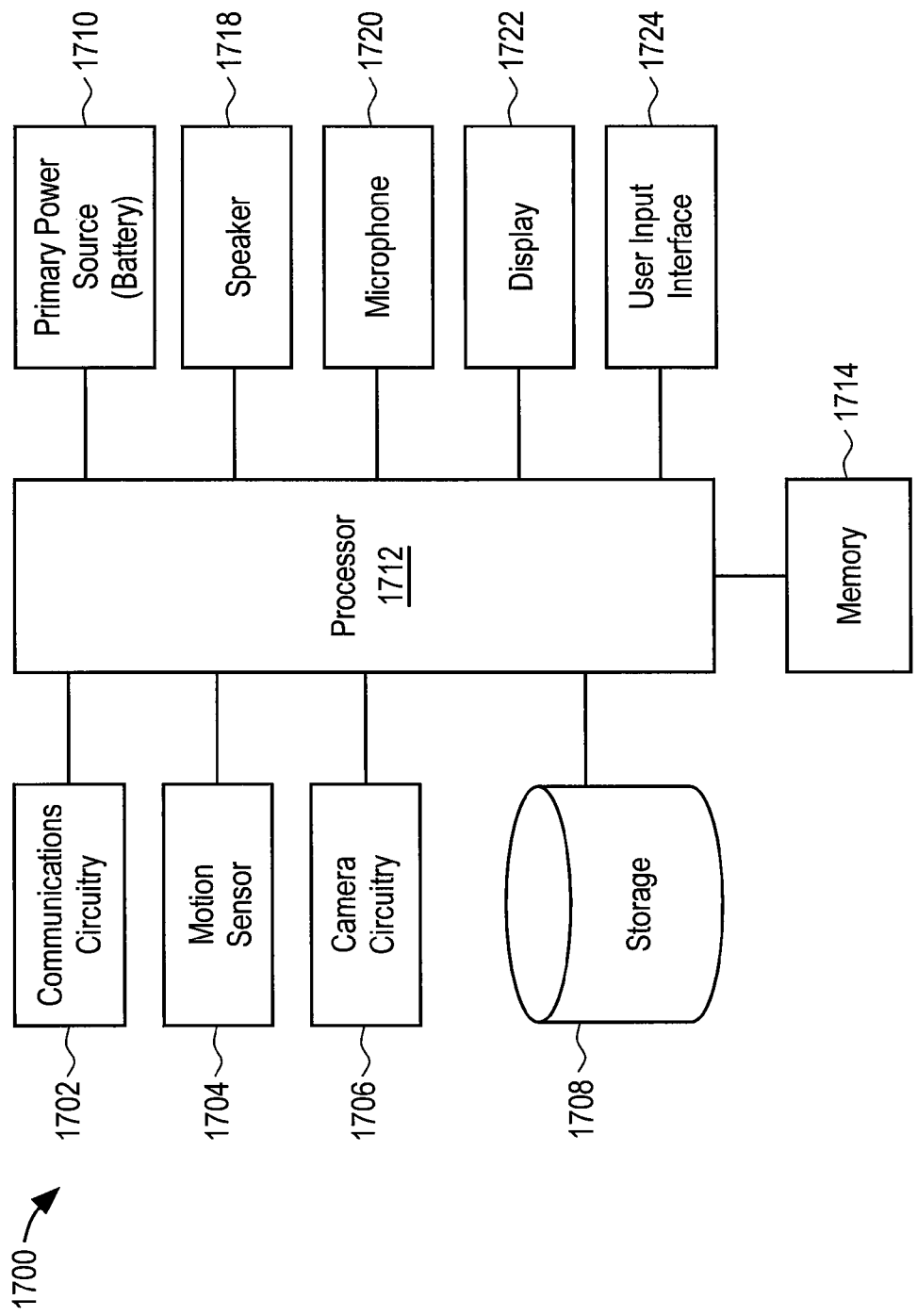
FIG. 17 illustrates a block diagram of some of the constituent components of an embodiment of an electronic device in which an embodiment of the invention may be implemented.

FIG. 17 illustrates a block diagram of some of the constituent components of an embodiment of an electronic device in which an embodiment of the invention may be implemented. Device 1700 may be any one of several different types of consumer electronic devices. For example, the device 1700 may be any camera-equipped mobile device, such as a cellular phone, a smart phone, a media player, or a tablet-like portable computer.

In this aspect, electronic device 1700 includes a processor 1712 that interacts with camera circuitry 1706, motion sensor 1704, storage 1708, memory 1714, display 1722, and user input interface 1724. Main processor 1712 may also interact with communications circuitry 1702, primary power source 1710, speaker 1718, and microphone 1720. The various components of the electronic device 1700 may be digitally interconnected and used or managed by a software stack being executed by the processor 1712. Many of the components shown or described here may be implemented as one or more dedicated hardware units and/or a programmed processor (software being executed by a processor, e.g., the processor 1712).

The processor 1712 controls the overall operation of the device 1700 by performing some or all of the operations of one or more applications or operating system programs implemented on the device 1700, by executing instructions for it (software code and data) that may be found in the storage 1708. The processor 1712 may, for example, drive the display 1722 and receive user inputs through the user input interface 1724 (which may be integrated with the display 1722 as part of a single, touch sensitive display panel). In addition, processor 1712 may send an audio signal to speaker 1718 to facilitate operation of speaker 1718.

Storage 1708 provides a relatively large amount of "permanent" data storage, using nonvolatile solid state memory (e.g., flash storage) and/or a kinetic nonvolatile storage device (e.g., rotating magnetic disk drive). Storage 1708 may include both local storage and storage space on a remote server. Storage 1708 may store data as well as software components that control and manage, at a higher level, the different functions of the device 1700.

In addition to storage 1708, there may be memory 1714, also referred to as main memory or program memory, which provides relatively fast access to stored code and data that is being executed by the processor 1712. Memory 1714 may include solid state random access memory (RAM), e.g., static RAM or dynamic RAM. There may be one or more processors, e.g., processor 1712, that run or execute various software programs, modules, or sets of instructions (e.g., applications) that, while stored permanently in the storage 1708, have been transferred to the memory 1714 for execution, to perform the various functions described above.

The device 1700 may include communications circuitry 1702. Communications circuitry 1702 may include components used for wired or wireless communications, such as two-way conversations and data transfers. For example, communications circuitry 1702 may include RF communications circuitry that is coupled to an antenna, so that the user of the device 1700 can place or receive a call through a wireless communications network. The RF communications circuitry may include a RF transceiver and a cellular baseband processor to enable the call through a cellular network. For example, communications circuitry 1702 may include Wi-Fi communications circuitry so that the user of the device 1700 may place or initiate a call using voice over Internet Protocol (VOIP) connection, transfer data through a wireless local area network.

The device may include a microphone 1720. In this aspect, microphone 1720 may be an acoustic-to-electric transducer or sensor that converts sound in air into an electrical signal. The microphone circuitry may be electrically connected to processor 1712 and power source 1710 to facilitate the microphone operation (e.g. tilting).

The device 1700 may include a motion sensor 1704, also referred to as an inertial sensor, that may be used to detect movement of the device 1700. The motion sensor 1704 may include a position, orientation, or movement (POM) sensor, such as an accelerometer, a gyroscope, a light sensor, an infrared (IR) sensor, a proximity sensor, a capacitive proximity sensor, an acoustic sensor, a sonic or sonar sensor, a radar sensor, an image sensor, a video sensor, a global positioning (GPS) detector, an RF or acoustic doppler detector, a compass, a magnetometer, or other like sensor. For example, the motion sensor 1704 may be a light sensor that detects movement or absence of movement of the device 1700, by detecting the intensity of ambient light or a sudden change in the intensity of ambient light. The motion sensor 1704 generates a signal based on at least one of a position, orientation, and movement of the device 1700. The signal may include the character of the motion, such as acceleration, velocity, direction, directional change, duration, amplitude, frequency, or any other characterization of movement. The processor 1712 receives the sensor signal and controls one or more operations of the device 1700 based in part on the sensor signal.

The device 1700 also includes camera circuitry 1706 that implements the digital camera functionality of the device 1700. One or more camera modules having image sensors (e.g. camera module 100 or camera module 200) are built into the device 1700, and each may be located at a focal plane of an optical system that includes a respective lens. An optical image of a scene within the camera's field of view is formed on the image sensor, and the sensor responds by capturing the scene in the form of a digital image or picture consisting of pixels that may then be stored in storage 1708. The camera circuitry 1706 may also be used to capture video images of a scene.

Device 1700 also includes primary power source 1710, such as a built in battery, as a primary power supply.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A camera module comprising:
    a microelectronic die having a top side and a bottom side, an image sensor is positioned on the top side of the microelectronic die and a conductive via is formed through the microelectronic die to provide an electrical connection between the top side and the bottom side;
    an overmold casing formed around the die, wherein the overmold casing is molded directly to, and contacts, at least a portion of the top side of the die; and
    a lens holder assembly coupled to the top side of the microelectronic die and the overmold casing.

2. The camera module of claim 1 further comprising:
a transparent member positioned over the image sensor, the transparent member being attached directly to the top side of the microelectronic die and surrounded by the overmold casing.

3. The camera module of claim 1 further comprising:
a metal layer, wherein the metal layer is (a) on one of the top side or the bottom side of the microelectronic die and (b) extends from the via to the overmold casing to redistribute the electrical connection to a location outside of the microelectronic die.

4. The camera module of claim 1 further comprising:
an electronic device electrically connected to the conductive via and encased within the overmold casing.

5. The camera module of claim 4 where the electronic device is a passive surface-mount device that is mounted along the top side of the microelectronic die.

6. The camera module of claim 4 wherein the electronic device is electrically connected to the conductive via by a redistribution layer encased within the overmold casing.

7. The camera module of claim 2 wherein the overmold casing is molded directly to, and contacts, sidewalls of the microelectronic die and the transparent member.

8. The camera module of claim 1 wherein the overmold casing is made of a polymer, an elastomer, a glass, or a thermoplastic material.

9. A method of producing a camera module, the method comprising:
providing a carrier having an adhesive tape layer;
attaching a microelectronic die to the adhesive tape layer, the microelectronic die having a first side with an image sensor formed thereon and a second side, and wherein a conductive via is formed between the first side and the second side, the adhesive tape layer being attached to the second side;
after attaching the microelectronic die to the adhesive tape layer, attaching a transparent member to the first side of the microelectronic die, the transparent member being positioned over the image sensor such that the image sensor is enclosed between the microelectronic die and the transparent member; and
molding a mold material around exposed surfaces of the microelectronic die to form a casing around the microelectronic die and the transparent member.

10. The method of claim 9 further comprising:
positioning a lens holder assembly over the transparent member and the casing to form an overmolded camera module; and
removing the carrier having the adhesive tape layer such that the second side of the microelectronic die is exposed.

11. The method of claim 9 wherein molding comprises:
positioning a mold cope over the microelectronic die and the transparent member; and
injecting the mold material between the mold cope and the carrier to form the casing.

12. The method of claim 9 further comprising:
prior to attaching the lens holder assembly, removing the adhesive tape layer and carrier attached thereto to expose the second side of the microelectronic die; and
forming a redistribution layer between the via and the casing.

13. The method of claim 9 wherein the casing comprises a first casing and a second casing, the method further comprising:
prior to attaching the transparent member to the first side of the microelectronic die, molding a first mold material around the microelectronic die to form the first casing;
forming a redistribution layer between an end of the via at the first side of the microelectronic die and the first casing;
positioning a surface-mount device over the first side of the microelectronic die and the first casing, the surface-mount device being electrically connected to the redistribution layer; and
molding a second mold material around the surface-mount device to form the second casing, wherein the surface-mount device and redistribution layer are encased within the first casing and the second casing.

14. A method of producing a camera module, the method comprising:
providing an image sensor die that is overmolded within a casing, the image sensor die having a top side and a bottom side, wherein an image sensor and a transparent member are positioned on the top side, a conductive via is formed through the image sensor die from the top side to the bottom side, and the casing is molded directly to a portion of the top side of the image sensor die and surrounds the transparent member; and
coupling a lens holder assembly to the top side of the image sensor die.

15. The method of claim 14 wherein an injection molding process is used to overmold the image sensor die within the casing.

16. The method of claim 15 wherein the injection molding process comprises:
injection molding a first casing around the image sensor die; and
forming a redistribution layer on the top side of the image sensor die and the first casing;
mounting a surface-mount device over the redistribution layer and the first casing; and
injection molding a second casing over the surface-mount device and the first casing.

17. The method of claim 14 further comprising:
an electronic device electrically connected to the image sensor die and encased within the casing.

18. The method of claim 14 further comprising:
forming a redistribution layer between the via and the casing.

19. The method of claim 18 wherein the redistribution layer is formed on the top side of the die and encased within the casing.

20. The method of claim 18 wherein the redistribution layer is formed on the bottom side of the die.

* * * * *